(12) United States Patent
Wang et al.

(10) Patent No.: US 10,535,774 B1
(45) Date of Patent: Jan. 14, 2020

(54) MODULAR MEMORY-LIKE LAYOUT FOR FINFET ANALOG DESIGNS

(71) Applicant: Marvell International Ltd., Hamilton (BM)

(72) Inventors: Hui Wang, Pleasanton, CA (US); Runzi Chang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 16/019,997

(22) Filed: Jun. 27, 2018

Related U.S. Application Data

(60) Provisional application No. 62/542,601, filed on Aug. 8, 2017.

(51) Int. Cl.
| | |
|---|---|
| *H01L 29/76* | (2006.01) |
| *H01L 29/78* | (2006.01) |
| *H01L 27/088* | (2006.01) |
| *H01L 29/66* | (2006.01) |
| *H01L 29/10* | (2006.01) |
| *H01L 21/8234* | (2006.01) |

(52) U.S. Cl.
CPC .. *H01L 29/7856* (2013.01); *H01L 21/823431* (2013.01); *H01L 27/0886* (2013.01); *H01L 29/1079* (2013.01); *H01L 29/66795* (2013.01)

(58) Field of Classification Search
CPC ......... H01L 21/823431; H01L 27/0886; H01L 29/7856
See application file for complete search history.

(56) References Cited

U.S. PATENT DOCUMENTS

2016/0149013 A1\* 5/2016 Chou .................... H01L 21/845
257/410

\* cited by examiner

*Primary Examiner* — Samuel A Gebremariam

(57) ABSTRACT

A fin field effect transistor (finFET) includes a semiconductor substrate including at least one fin feature, a diffusion region formed on the semiconductor substrate and extending through the diffusion region, and a gate formed on the diffusion region and the at least one fin feature. The gate includes a split gate structure including a first gate region, a second gate region, a gap separating the first gate region and the second gate region, and a contact region electrically connecting the first gate region and the second gate region. A plurality of source/drain regions are formed in the diffusion region. The plurality of source/drain regions includes a source drain region in the gap between the first gate region and the second gate region. A plurality of pocket dopant regions are formed in the diffusion region. The plurality of pocket dopant regions includes at least one pocket dopant region in the gap between the first gate region and the second gate region.

8 Claims, 5 Drawing Sheets

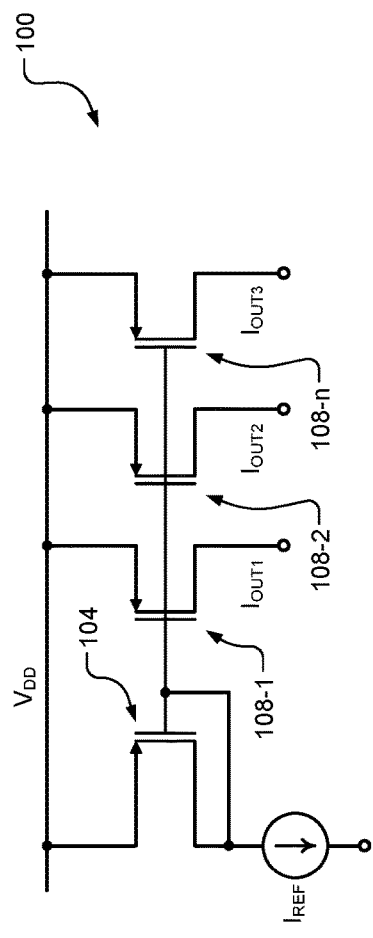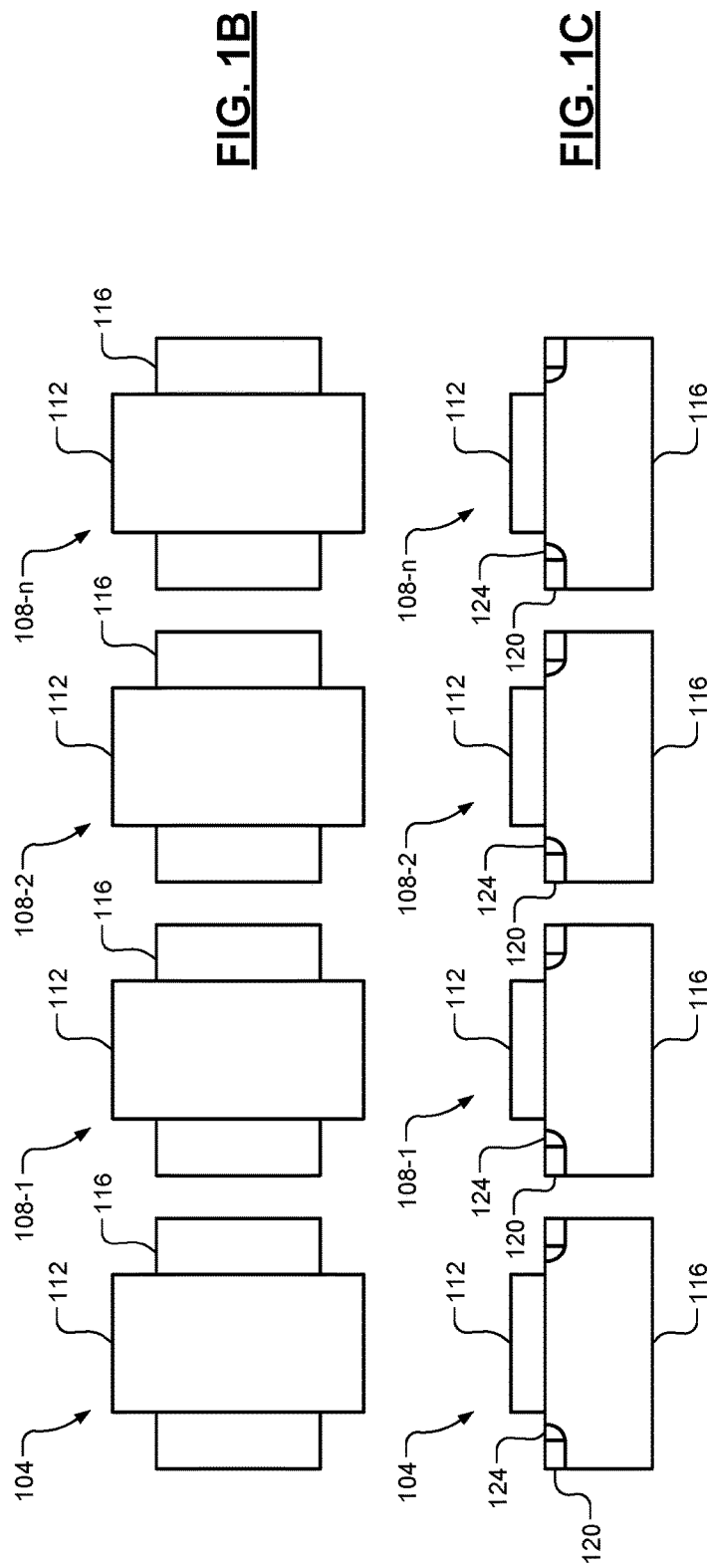
FIG. 1A
FIG. 1B
FIG. 1C

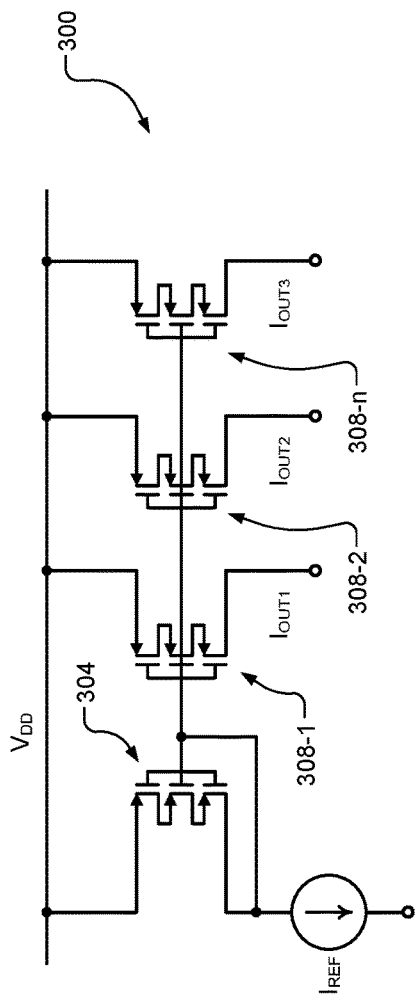
FIG. 3A
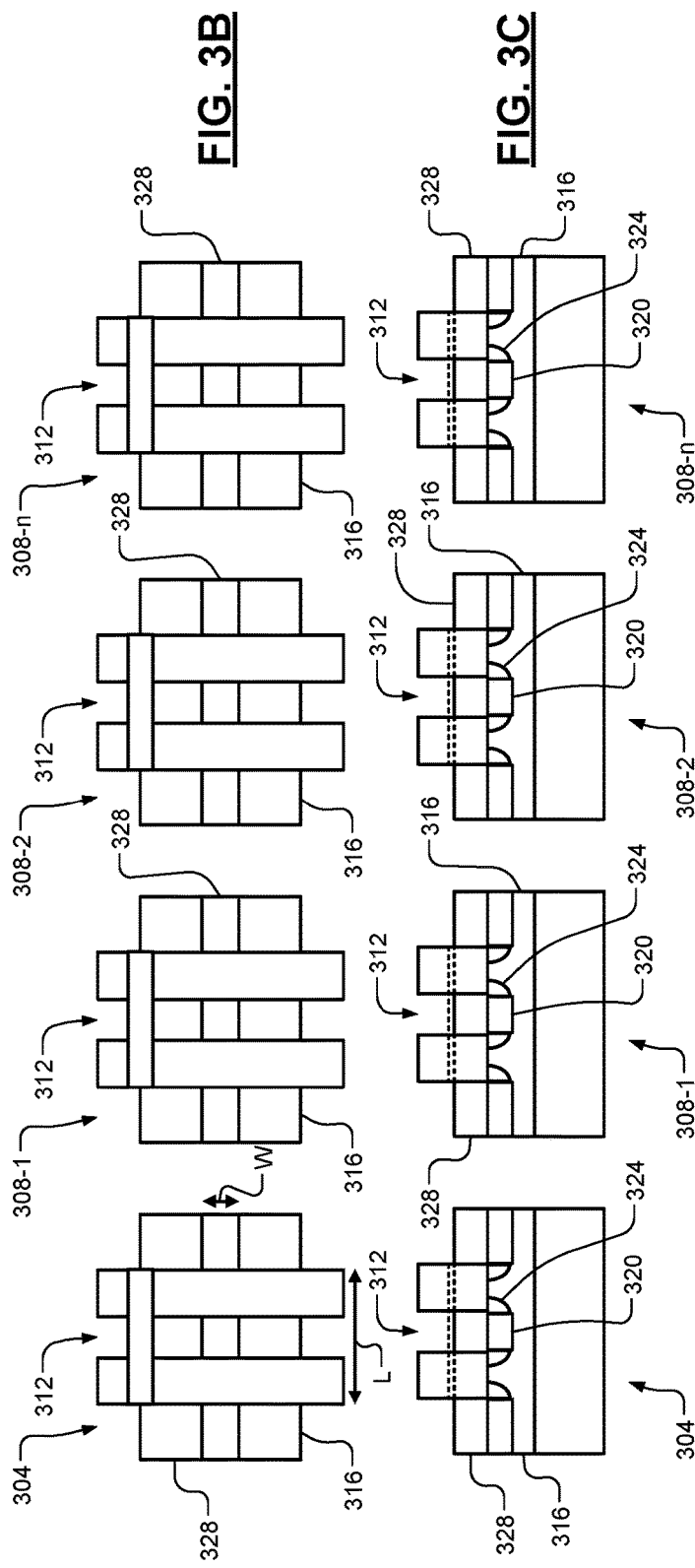
FIG. 3B
FIG. 3C

MODULAR MEMORY-LIKE LAYOUT FOR FINFET ANALOG DESIGNS

CROSS-REFERENCE TO RELATED APPLICATIONS

This application claims the benefit of U.S. Provisional Application No. 62/542,601, filed on Aug. 8, 2017. The entire disclosure of the application referenced above is incorporated herein by reference.

FIELD

The present disclosure relates to device matching in analog circuit unit cell layouts.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In analog circuit designs, circuit performance is largely dependent upon device matching (e.g., matching of respective sizes of a plurality of similar devices in a circuit). For example, in fin field effect transistor (finFET) circuits, mismatches in device width (W) and length (L) of finFET devices may degrade performance of the circuit. Due to process limitations in manufacturing of the devices (e.g., photolithography, etch, and chemical mechanical planarization process limitations), satisfying various design requirements (e.g., width, length, spacing, and density requirements) while minimizing mismatching is increasingly difficult. For example, as device size decreases (e.g., to increase density), device mismatch increases.

SUMMARY

A fin field effect transistor (finFET) includes a semiconductor substrate including at least one fin feature, a diffusion region formed on the semiconductor substrate and extending through the diffusion region, and a gate formed on the diffusion region and the at least one fin feature. The gate includes a split gate structure including a first gate region, a second gate region, a gap separating the first gate region and the second gate region, and a contact region electrically connecting the first gate region and the second gate region. A plurality of source/drain regions are formed in the diffusion region. The plurality of source/drain regions includes a source drain region in the gap between the first gate region and the second gate region. A plurality of pocket dopant regions are formed in the diffusion region. The plurality of pocket dopant regions includes at least one pocket dopant region in the gap between the first gate region and the second gate region In other features, the diffusion region is an N-type well diffusion region and the source/drain regions are P-type source/drain regions. The gate includes at least one of poly-silicon, a metal, and an alloy. The at least one fin feature includes a first fin feature and a second fin feature.

In other features, a circuit includes a plurality of the finFETs. The plurality of the finFETs includes a first finFET configured to output a reference current and a second finFET and a third finFET each configured as a mirror current device to output a current mirroring the reference current. Each of the first finFET, the second finFET, and the third finFET includes a split gate structure.

In other features, an array includes a plurality of the finFETs, and each of the plurality of finFETs corresponds to a unit cell device. The gate is shared by a plurality of the unit cell devices aligned in a vertical direction and the at least one fin feature is shared by a plurality of the unit cell devices aligned in a horizontal direction.

A method of forming a fin field effect transistor (finFET) includes providing a semiconductor substrate including at least one fin feature and forming a diffusion layer on the semiconductor substrate. The at least one fin feature extends through the diffusion layer. The method further includes forming a gate layer on the diffusion layer and the at least one fin feature, splitting the gate layer into a split gate structure including a first gate region, a second gate region, and a gap separating the first gate region and the second gate region, doping the gate layer, and doping the diffusion layer to form a plurality of source/drain regions. The plurality of source/drain regions includes a source/drain region in the gap between the first gate region and the second gate region. Dopants are injected into the diffusion layer to form a diffusion region having a plurality of pocket dopant regions. The plurality of pocket dopant regions includes at least one pocket dopant region in the gap between the first gate region and the second gate region.

In other features, the method includes forming a contact region to electrically connect the first gate region and the second gate region. The diffusion region is an N-type well diffusion region and the source/drain regions are P-type source/drain regions. The method includes forming the gate layer using at least one of poly-silicon, a metal, and an alloy.

In other features, the method includes forming the at least one fin feature on the semiconductor substrate. Forming the at least one fin feature on the semiconductor substrate includes forming a first fin feature and a second fin feature. Splitting the gate layer includes etching the gate layer.

In other features, the method includes arranging a plurality of the finFETs into a circuit. Arranging the plurality of the finFETs into the circuit includes arranging a first finFET to output a reference current and arranging a second finFET and a third finFET to output a current mirroring the reference current. Each of the first finFET, the second finFET, and the third finFET includes a split gate structure.

In other features, the method includes arranging a plurality of the finFETs into an array. Each of the plurality of finFETs corresponds to a unit cell device. The split gate structure is shared by a plurality of the unit cell devices aligned in a vertical direction and the at least one fin feature is shared by a plurality of the unit cell devices aligned in a horizontal direction.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 1A is a schematic of an example circuit including a reference device and current mirror devices.

FIG. 1B is a layout (plan) view of the reference device and the current mirror devices of FIG. 1A.

FIG. 1C is a side (cross-sectional) view of the reference device and the current mirror devices of FIG. 1A.

FIG. 3A is a schematic of an example circuit including a reference device and current mirror devices having a split gate structure according to the principles of the present disclosure.

FIG. 3B is a layout (plan) view of the reference device and the current mirror devices of FIG. 3A according to the principles of the present disclosure.

FIG. 3C is a side (cross-sectional) view of the reference device and the current mirror devices of FIG. 3A according to the principles of the present disclosure.

In the drawings, reference numbers may be reused to identify similar and/or identical elements.

DESCRIPTION

Figures 2A, 2B, 2C:
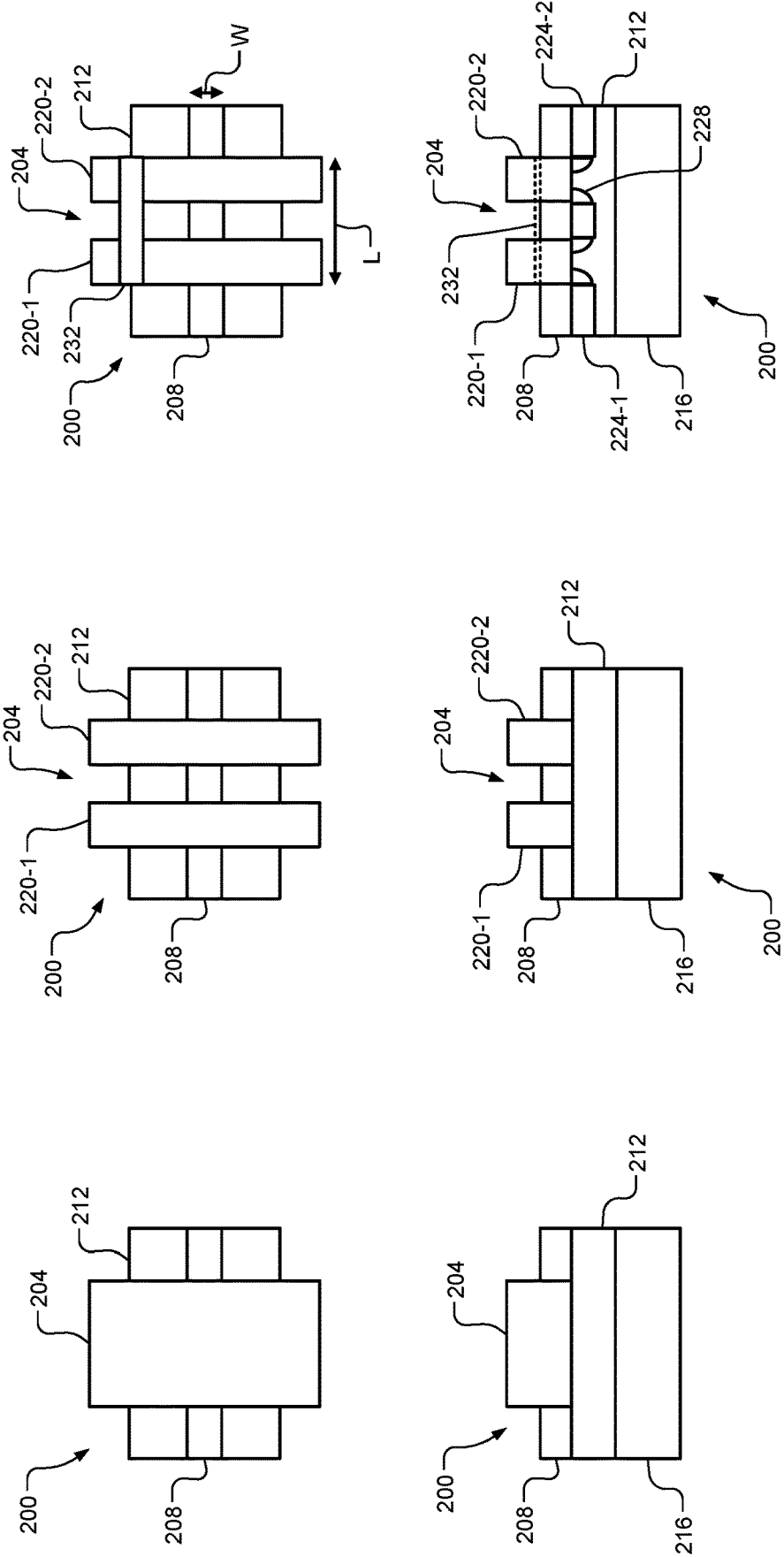
FIGS. 2A, 2B, and 2C show an example process for forming a finFET device having a split gate structure in a plan view and a side view according to the principles of the present disclosure.

Increasing device size in fin field effect transistor (finFET) circuits decreases device mismatch. Accordingly, in some analog circuit designs, larger finFET devices may be implemented to achieve a lower variance of a threshold voltage $V_T$ among adjacent transistors (i.e., $\sigma V_T$, in accordance with Pelgrom's Law). However, in nanometer (nm) devices, variations in metal gate thickness (and, therefore, of the metal gate work function), pocket implant dosages under the gate, etc. further determine $\sigma V_T$. Further, in deep sub-100 nm metal oxide semiconductor (MOS) FET devices (e.g., planar or FinFET devices), an amount of implanted dopants (e.g., N-type pocket dopants for PMOS devices or P-type pocket dopants for NMOS devices) is very low. In these examples, random dopant fluctuation (RDF) and/or shot noise associated with dopant implantation further affect device mismatch. For example, a standard deviation of shot noise is equal to a square root of an average number of events (dopants) N and a percentage of variation is normalized to $\sqrt{N}/N$, or $1/\sqrt{N}$. Accordingly, as N increases (i.e., as the number of dopants increases), device matching improves.

FIG. 1A shows a layout of an example circuit 100 including a reference device 104 and current mirror devices 108-1, 108-2, . . . , and 108-n, referred to collectively as current mirror devices 108. The current mirror devices 108 generate currents $I_{OUT1}$, $I_{OUT2}$, and $I_{OUT2}$ to mirror a reference current $I_{REF}$ generated by the reference device 104. FIG. 1B shows the reference device 104 and the current mirror devices 108 in a layout (e.g., plan) view. FIG. 1C shows the reference device 104 and the current mirror devices 108 in a cross-sectional view. Each of the reference device 104 and the current mirror devices 108 includes a gate 112 formed on a diffusion region 116 (e.g., an N-type well diffusion region). The diffusion region 116 includes source/drain regions 120 and pocket implant regions 124 (e.g., regions including pocket implants/dopants).

In this example, each of the reference device 104 and the current mirror devices 108 corresponds to a single large device. In other words, each of the current mirror devices 108 is implemented using a single transistor to reduce a gate length variation percentage. However, increasing the device size (e.g., device width and length, or W/L) without increasing a number of dopants N does not eliminate device mismatch, and the layout area of the circuit 100 is associated with low utilization efficiency. Further, metal thickness and metal gate work function subsequent to chemical mechanical planarization is a function of layout uniformity. Accordingly, increasing device size may increase variations in pattern density across a circuit, thereby increasing $V_T$ mismatch (i.e., increasing $\sigma V_T$).

FinFET circuit systems and methods according to the principles of the present disclosure include finFET devices having a split gate structure. Each finFET device is initially formed as a unit cell device having a desired width and length (e.g., W/L) satisfying performance requirements (e.g., gain Gm, output resistance $R_{out}$, etc.). For example, the finFET device corresponds to a gate (e.g., comprised of poly-silicon (poly-si), metal, an alloy, etc.) formed on a fin of an active diffusion area (e.g., an oxide diffusion, or OD, area) comprising source and drain regions. The gate is then split into two or more separate regions. In other words, a split gate structure having the same W/L is formed. Additional dopants may be added to a region of the OD area between the two regions of the split gate structure. In this manner, the number of dopants N in the OD area of the finFET device is increased while maintaining a desired W/L to minimize device mismatch across a plurality of the finFET devices.

FIGS. 2A, 2B, and 2C show an example process for forming a finFET device 200 in a plan view and a side view according to the principles of the present disclosure. A gate 204 having a width W and a length L is formed across a fin feature 208 of an OD area such as a diffusion region 212 (e.g., an N-type well diffusion region). For example, the diffusion region 212 is formed on a substrate 216 and the fin feature 208 extends upward from the substrate 216 and through the diffusion region 212.

FIG. 2B shows the gate 204 split into a split gate structure including two separate gate regions 220-1 and 220-2, referred to collectively as gate regions 220. In other words, the gate regions 220 are separated by a gap. Although shown split into two of the gate regions 220, the gate 204 may be split into three or more of the separate gate regions 220. For example, the gate 204 may be etched to form the split gate structure.

FIG. 2C shows the finFET device 200 with source/drain regions 224-1, 224-2, and 224-3 (e.g., P-type source/drain regions, referred to collectively as source/drain regions 224) and pocket implant regions 228 formed in the diffusion region 212. The pocket implant regions 228 include dopants injected into the diffusion region 212. As shown in FIG. 2C, the split gate structure allows additional dopants to be injected into the diffusion region 212 between the gate regions 220-1 and 220-2. The increased number of dopants minimizes device mismatch as described above. Further, a contact region 232 is formed across the gate regions 220. Accordingly, a conductive path is provided between the gate regions 220. In this manner, a width W and an effective length L of the gate 204 is maintained. In other words, the width W and length L of the split gate structure shown in FIG. 2C are the same as the gate 204 shown in FIG. 2A.

FIG. 3A shows a layout of an example circuit 300 including a reference device 304 and current mirror devices 308-1, 308-2, . . . , and 308-n, referred to collectively as current mirror devices 308. Each of the reference device 304 and the current mirror devices 308 has a split gate structure.

For example, the reference device 304 and the current mirror devices 308 are formed as described above in FIGS. 2A, 2B, and 2C. Accordingly, a gate of a unit cell device having a predetermined width and length W/L is divided, in a channel length direction, into multiple gate regions connected together to form a split gate structure having a same effective width and length W/L as the unit cell device, and multiple devices (e.g., the reference device 304 and the current mirror devices 308) are stacked together as shown in FIG. 3A.

The current mirror devices 308 generate currents $I_{OUT1}$, $I_{OUT2}$, and $I_{OUT2}$ to mirror a reference current $I_{REF}$ generated by the reference device 304. FIG. 3B shows the reference device 304 and the current mirror devices 308 in a layout (e.g., plan) view. FIG. 3C shows the reference device 304 and the current mirror devices 308 in a cross-sectional view. Each of the reference device 304 and the current mirror devices 308 includes a gate 312 formed on a diffusion region 316 (e.g., an N-type well diffusion region). The diffusion region 316 includes source/drain regions 320 and pocket implant regions 324 (e.g., source/drain regions including pocket implants/dopants). The reference device 304 and the current mirror devices 308 include the source/drain regions 320 and the pocket implant regions 324 between respective regions of the split gate structure as described above in FIGS. 2A, 2B, and 2C.

Accordingly, the number of dopants for each of the reference device 304 and the current mirror devices 308 is increased to optimize device matching and improve pattern density uniformity. For example, since variance a of a threshold voltage $V_T$ ($\sigma V_T$) is proportional to $1/\sqrt{N}$ (where N is the number of dopants in a device), increasing the number of dopants N decreases $\sigma V_T$. For X stacked devices (e.g., for X=3 of the stacked current mirror devices 308 as shown in FIG. 3A), the variance $\sigma V_T$ becomes modified in accordance with $1/\sqrt{(N*X)}$ and is therefore further reduced.

Figure 4:
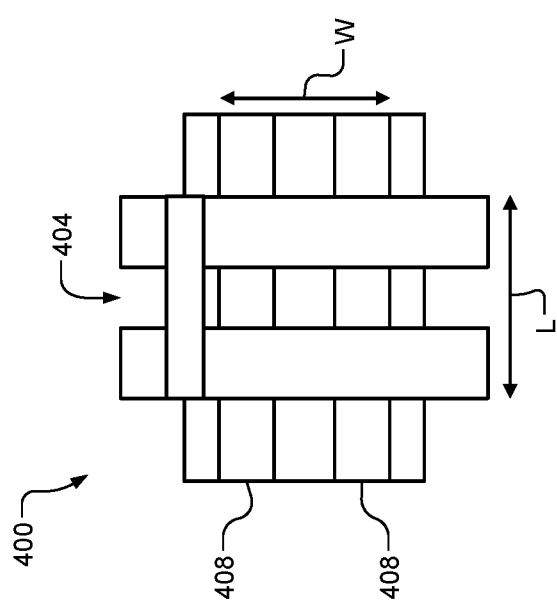
FIG. 4 is a layout (plan) view of an example finFET device having a split gate structure and multiple fin features according to the principles of the present disclosure.

Although shown with a single fin feature 328, each of the reference device 304 and the current mirror devices 308 may include multiple (e.g., two or more) of the fin features 328. For example, FIG. 4 shows an example finFET device 400 including a gate 404 having a split gate structure and multiple (as shown, two) fin features 408 according to the principles of the present disclosure.

Figure 5:
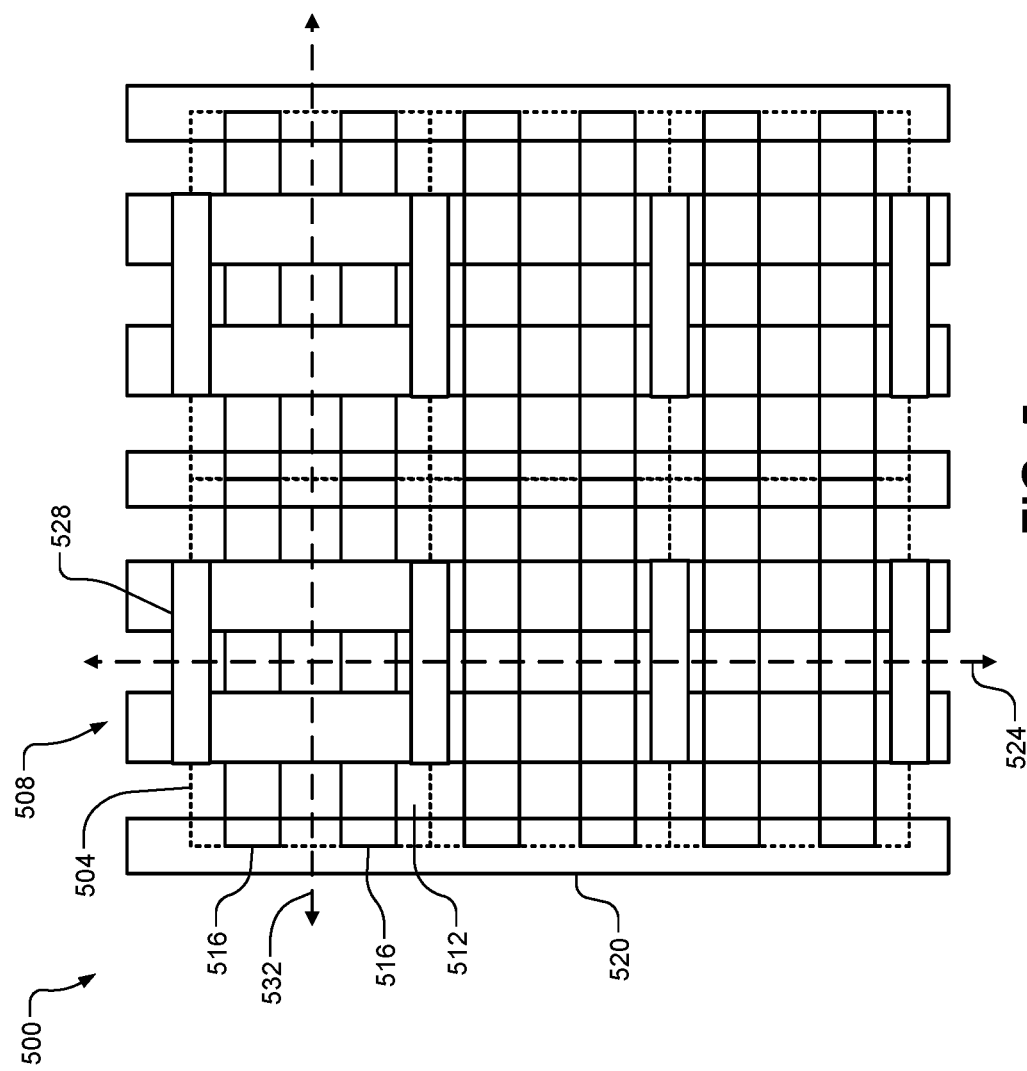
FIG. 5 is a layout (plan) view of an array of example finFET devices having a split gate structure and multiple fin features according to the principles of the present disclosure.

FIG. 5 shows a layout (plan) view of an array 500 of example finFET devices 504 having a split gate structure according to the principles of the present disclosure. For example, each of the finFET devices 504 includes a gate 508 formed on a diffusion region 512 and fin features 516. The array 500 may be manufactured to include any number of the finFET devices 504. Accordingly, respective features that are shared by the devices 504 may be formed in a same process step to minimize non-uniformities. For example, features such as the gates 508 and diffusion area contact regions 520 may be shared between the devices 504 aligned in a vertical direction 524. Conversely, features such as the fin features 516 and gate contact regions 528 may be shared between the devices 504 in a horizontal direction 532. In this manner, differences between effective widths W and lengths L of the devices 504 are minimized. Further, more uniform spacing of the gates 508 is achieved to reduce parasitic resistance and minimize layout area, and line edge roughness (LER) effects are decreased.

Figure 6:
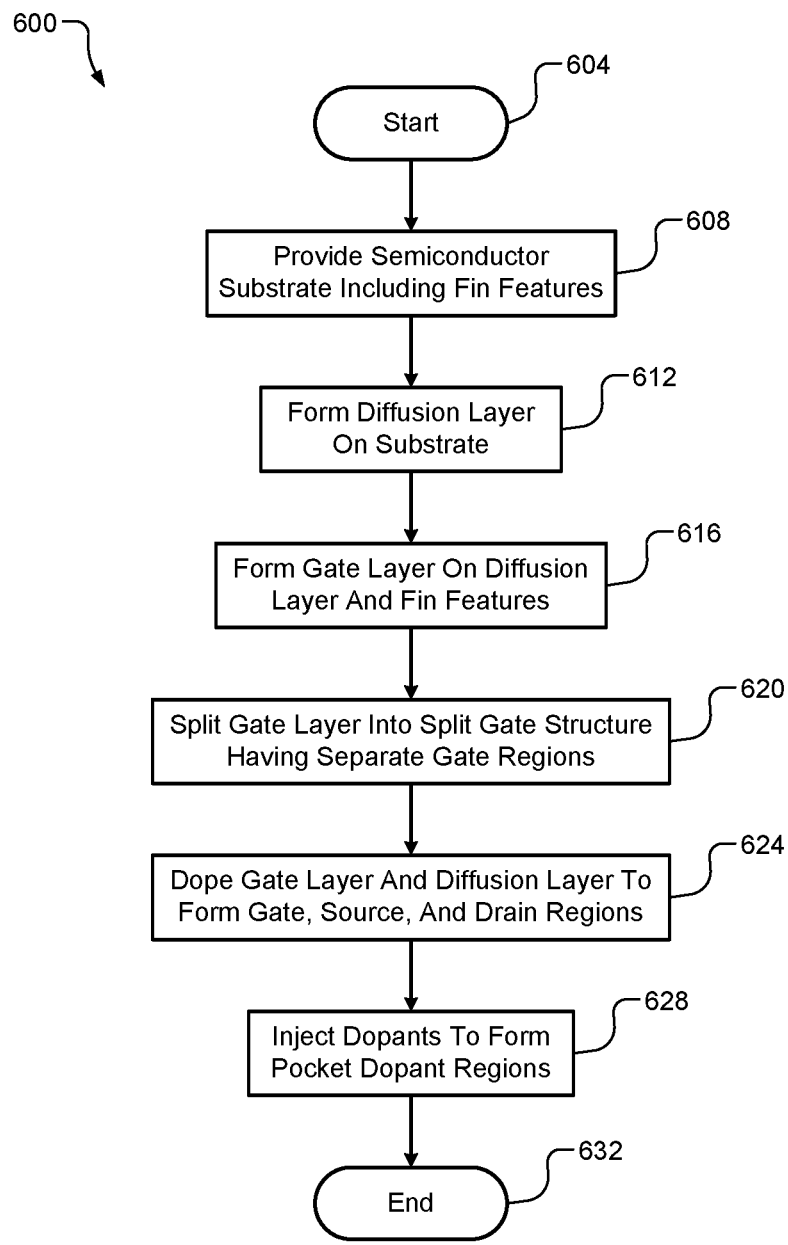
FIG. 6 is an example method of forming a finFET device having a split gate structure according to the principles of the present disclosure.

FIG. 6 is an example method 600 of forming a finFET device having a split gate structure according to the principles of the present disclosure. Although described with respect to forming a unit cell device, the method 600 as described may also be applied to forming an array of devices as shown in FIG. 5. The method 600 starts at 604. At 608, a semiconductor substrate with one or more fin features is provided. For example, the semiconductor substrate may be arranged in a semiconductor substrate processing chamber. The semiconductor substrate may be formed in the semiconductor substrate processing chamber or transferred to the processing chamber from a different processing chamber. At 612, a diffusion layer is formed on the substrate. For example, the diffusion layer may be formed using any suitable semiconductor deposition method, such as atomic layer deposition, chemical vapor deposition, plasma-enhanced chemical vapor deposition, etc.

At 616, a gate layer (e.g., a poly-silicon layer, metal layer, alloy layer, etc.) is formed on the diffusion layer and fin features. The gate layer is formed having a desired width and length (W/L) satisfying performance requirements of a unit cell device. At 620, the gate layer is split into a split gate structure including two separate gate regions. For example, the gate layer may be etched to form the split gate structure. The gate layer may be etched in a same or different processing chamber used to deposit the diffusion layer and/or the gate layer. At 624, the gate layer and diffusion layer are doped to form gate, source, and drain regions. At 628, one or more additional doping steps are performed to inject dopants and form pocket dopant regions. The pocket dopant regions are formed on either side of the gate and between the separate gate regions of the split gate structure as described above in FIGS. 2-5. The method 600 ends at 632.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

What is claimed is:

1. A fin field effect transistor (finFET), comprising:
    a semiconductor substrate including at least one fin feature;
    a diffusion region formed on the semiconductor substrate, wherein the at least one fin feature extends through the diffusion region;
    a gate formed on the diffusion region and the at least one fin feature, wherein the gate comprises a split gate structure including a first gate region, a second gate region, a gap separating the first gate region and the second gate region, and a contact region electrically connecting the first gate region and the second gate region;
    a plurality of source/drain regions formed in the diffusion region, wherein the plurality of source/drain regions includes a source/drain region in the gap between the first gate region and the second gate region; and
    a plurality of pocket dopant regions formed in the diffusion region, wherein the plurality of pocket dopant regions includes at least one pocket dopant region in the gap between the first gate region and the second gate region.

2. The finFET of claim 1, wherein the diffusion region is an N-type well diffusion region and the source/drain regions are P-type source/drain regions.

3. The finFET of claim 1, wherein the gate comprises at least one of poly-silicon, a metal, and an alloy.

4. The finFET of claim 1, wherein the at least one fin feature includes a first fin feature and a second fin feature.

5. A circuit comprising a plurality of the finFETs of claim 1.

6. The circuit of claim 5, wherein the plurality of the finFETs comprises:
    a first finFET configured to output a reference current; and
    a second finFET and a third finFET each configured as a mirror current device to output a current mirroring the reference current,
    wherein each of the first finFET, the second finFET, and the third finFET comprises a split gate structure.

7. An array of a plurality of the finFETs of claim 1, wherein each of the plurality of finFETs corresponds to a unit cell device.

8. The array of claim 7, wherein (i) the gate is shared by a plurality of the unit cell devices aligned in a vertical direction and (ii) the at least one fin feature is shared by a plurality of the unit cell devices aligned in a horizontal direction.

* * * * *